US006983234B1

(12) United States Patent
Hangal et al.

(10) Patent No.: US 6,983,234 B1
(45) Date of Patent: Jan. 3, 2006

(54) SYSTEM AND METHOD FOR VALIDATING PROCESSOR PERFORMANCE AND FUNCTIONALITY

(75) Inventors: Sudheendra Hangal, Sunnyvale, CA (US); James M. O'Connor, Union City, CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/531,026

(22) Filed: Mar. 20, 2000

Related U.S. Application Data

(60) Provisional application No. 60/127,368, filed on Apr. 1, 1999.

(51) Int. Cl.
*G06F 17/50* (2006.01)
(52) U.S. Cl. ............................ 703/14; 703/13; 703/19; 703/21; 703/22; 717/124; 717/127; 717/129; 717/135
(58) Field of Classification Search .................. 703/13, 703/14, 22, 19, 21; 717/124, 127, 129, 135
See application file for complete search history.

(56) References Cited

U.S. PATENT DOCUMENTS 5,615,357 A * 3/1997 Ball ............................ 703/21

6,059,835 A * 5/2000 Bose ........................... 703/19
6,199,031 B1 * 3/2001 Challier et al. ................ 703/14

OTHER PUBLICATIONS

Lauterbach, "Accelerating Architectural Simulation by Parallel Execution of Trace Samples", Tech. Report SMLI TR-93-22, Sun Microsystems Laboratories, Inc., Dec. 1993, pp. 1-14.*
Maturana et al., "Incas: A Cycle Accurate Model of UltraSPARC™", Proceedings of 1995 IEEE International Conference on Computer Design: VLSI in Computers and Processors, Oct. 1995, pp. 130-135.*
Hangal et al., "Performance Analysis And Validation of the Pico Java Processor," *IEEE Micro* pp 66-72 (1999).

* cited by examiner

*Primary Examiner*—Thai Phan
*Assistant Examiner*—Herng-der Day
(74) *Attorney, Agent, or Firm*—Townsend and Townsend and Crew LLP

(57) ABSTRACT

A method and system for accurately validating performance and functionality of a processor in a timely manner is provided. First, a program is executed on a high level simulator of the processor. Next, a plurality of checkpoints are established. Then, state data at each of the checkpoints is saved. Finally, the program is run on a plurality of low level simulators of the processor in parallel, where each of the low level simulators is started at a corresponding checkpoint with corresponding state data associated with the corresponding checkpoint.

10 Claims, 7 Drawing Sheets

SYSTEM AND METHOD FOR VALIDATING PROCESSOR PERFORMANCE AND FUNCTIONALITY

This application claims the benefit of U.S. Application No. 60/127,368, filed Apr. 1, 1999, the disclosure of which is incorporated by reference.

BACKGROUND OF THE INVENTION

The present invention relates generally to validating the design of a processor, and particularly to validating the performance and functionality of a processor by using both high level and low level simulators of the processor design.

Typically, such validation requires booting one or more operating systems and running lengthy benchmark or validation programs on a low level simulator, hardware or software model, of the processor. The results of these runs can then provide information as to (1) the correct operation, the functionality, of the processor as well as (2) the performance of the processor. FIG. 1A is a block diagram of a prior art processor validation system 100 using only a low level simulator 110.

Low Level Simulators

Various types of low level simulators are used in validating the design of a processor. One type of low level simulator is the register transfer level (RTL) model of the processor. The RTL model is a one hundred percent accurate representation of a processor and is the same model used to design the processor. The RTL model of a processor is often expressed as a VHDL model of the processor. The VHDL model of a processor simulates each logic element in the processor and is a highly accurate representation of the processor. Alternatively, the RTL model of a processor is often expressed as a Verilog model of the processor. Verilog is a type of hardware description language (HDL) and is a textual way to describe a processor. The Verilog model of a processor is also a highly accurate representation of the processor.

These low level simulators simulate in software each logic element and the connections between these logic elements of a processor. In addition, a RTL model, a VHDL model, or a Verilog model of a processor is the same model used to represent the design of the processor. Consequently, executing operating system bootup programs and executing long-running benchmark or validation programs on such low level simulators ensures that the performance indicated by the model is highly accurate and also validates the actual hardware design by running pieces of code on the low level simulator of the hardware design.

However, executing operating system bootup programs and such long-running benchmark programs on low level simulators is usually infeasible in practice since simulation of these programs on such a software model is very slow. Low level simulators typically run at a speed of tens or hundreds of hertz. For example, it would take twenty-five years to simulate some of the longer running benchmark programs on the RTL model of a typical processor. Also, in validating the functionality and/or performance of a two hundred megahertz processor, a low level simulator running at a speed of one hundred hertz would require two million minutes, or about 3.8 years, to run an operating system bootup program, which the real processor would require only one minute to execute.

Another type of low level simulator is a hardware emulator configured with the design of the processor. One type of hardware emulator is a set of field programmable gate arrays (FPGAs), which, when configured with the design of the processor, would map each logical element of the processor into reconfigured hardware of the FPGAs. Consequently, such a hardware emulator is much faster than the RTL, VHDL, or Verilog models of a processor. Typically, a hardware emulator runs at a speed in the tens of kilohertz. Therefore, in validating the functionality and/or performance of the aforementioned two hundred megahertz processor, a low level hardware emulator running at a speed of ten kilohertz would require twenty thousand minutes, or about 13.9 days, to run an operating system bootup program, which the processor would require only one minute to execute.

However, a typical hardware emulator, such as a Quickturn emulator, is very expensive and costs millions of dollars. In addition, such an emulator typically requires about twenty-four hours to compile a program and is difficult to use.

High Level Simulators

Faster types of simulators, high level simulators, may be used to evaluate (1) the functionality and (2) the performance of a processor. FIG. 1B is a block diagram of another prior art processor validation system 150, which includes a first high level simulator 160, a trace file sampler 170, and a second high level simulator 180. FIG. 1B is a simplified representation of the prior art processor validation system described in U.S. Pat. No. 5,615,357. In this system, the first high level simulator is an instruction accurate simulator (IAS), while the second high level simulator is a cycle accurate simulator (CAS).

A high level simulator of a processor is a functional representation of the processor. A high level simulator does not simulate each gate of a processor and does not simulate each connection of the processor. Two types of high level simulators are the IAS of a processor and the CAS of a processor.

An instruction accurate simulator (IAS) of a processor models the processor at a much higher level of abstraction than low level simulators. Typically, an IAS of a processor runs at speeds from one megahertz to one hundred megahertz. The IAS of a processor models processor functionality at an abstract level but does not model details of the processor like the timing of specific operations.

A cycle accurate simulator (CAS) of a processor models the processor at a higher level of abstraction than low level simulators. Typically, a CAS of a processor models the performance of a processor, models the timing of various operations within a processor, and is consequently slower than the IAS of the processor, while still being faster than the low level simulators.

Executing operating system boot up programs and executing long-running benchmark or validation programs on such high level simulators is much faster than executing them on low level simulators. For example, in validating the functionality and/or performance of the aforementioned two hundred megahertz processor, a high level simulator, particularly the IAS of a processor, running at a speed of one megahertz would require two hundred minutes, or about 3.3 hours, to run an operating system bootup program, which the processor would require only one minute to execute. However, the high level simulator cannot completely and accurately model the many complexities in a processor because the high level simulator only represents the functions of the processor and not every gate and not every connection of the processor. Therefore, executing operating system boot up programs and executing long-running benchmark or validation programs on a high level simulator, such as the IAS of a processor, neither validate the functionality of the processor nor give a highly accurate prediction of the performance of the processor.

For the foregoing reasons, a system and method that validates the performance and functionality of a processor in a highly accurate, timely, relatively inexpensive, and easy manner would benefit processor design.

SUMMARY OF THE INVENTION

The present invention provides a method and system for accurately validating performance and functionality of a processor in a timely manner. First, a program is executed on a high level simulator of the processor. Next, a plurality of checkpoints are established. Then, state data at each of the checkpoints is saved. Finally, the program is run on a plurality of low level simulators of the processor in parallel, where each of the low level simulators is started at a corresponding checkpoint with corresponding state data associated with the corresponding checkpoint.

In a specific embodiment, when running the program on the plurality of low level simulators, each of the low level simulators is loaded with the program. Next, each of the low level simulators is initialized at the corresponding checkpoint with the corresponding state data associated with the corresponding checkpoint. Then, the program is executed on the low level simulator up to a certain point in the program. In a further embodiment, the plurality of low level simulators generate functional data of the processor. In another embodiment, the plurality of low level simulators generate performance data of the processor.

In a specific embodiment, the checkpoints cover the program entirely. In another embodiment, the checkpoints cover random parts of the program. In another embodiment, the checkpoints cover overlapping parts of the program.

In a further embodiment, the checkpoints divide the program into determined length code fragments. In a specific embodiment, the determined length code fragments are equal length code fragments. In another embodiment, the checkpoints divide the program into random length code fragments.

The invention will be better understood by reference to the following detailed description in connection with the following drawings.

DESCRIPTION OF THE PREFERRED EMBODIMENT

In the description that follows, the present invention is explained in reference to a preferred embodiment. The description of the preferred embodiment that follows is intended to be illustrative, but not limiting, of the scope of the present invention as set forth in the claims.

Processor Validation System

Operation

Figure 1A:
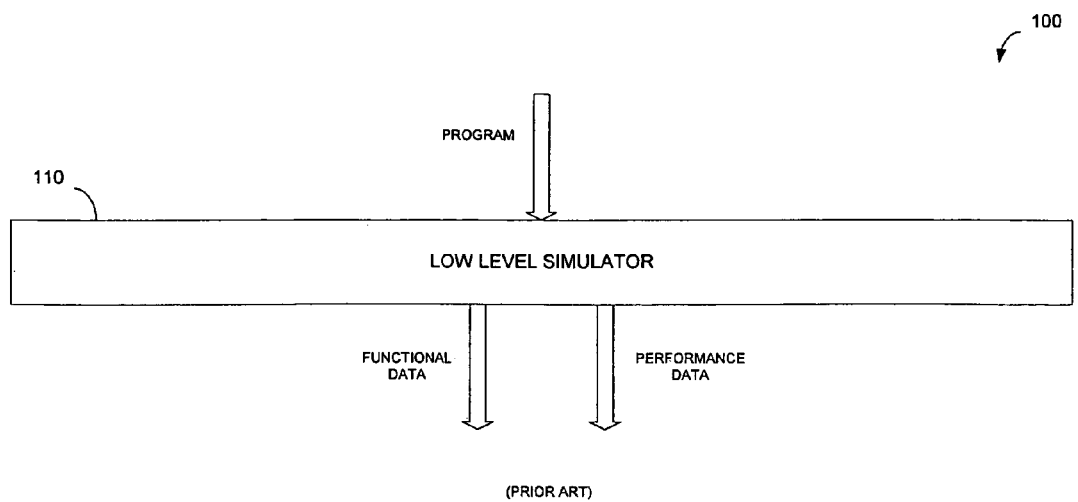
FIGS. 1A and 1B are block diagrams of prior art processor validation systems.
Figure 1B:
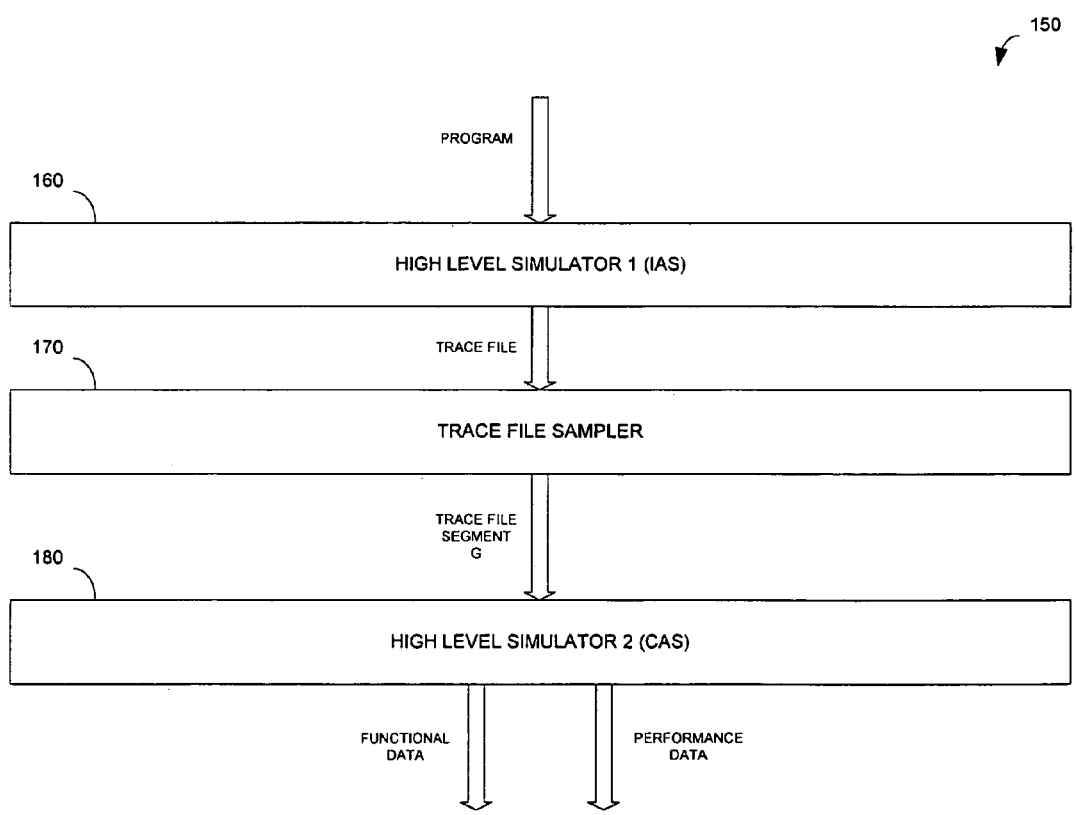
Figure 2:
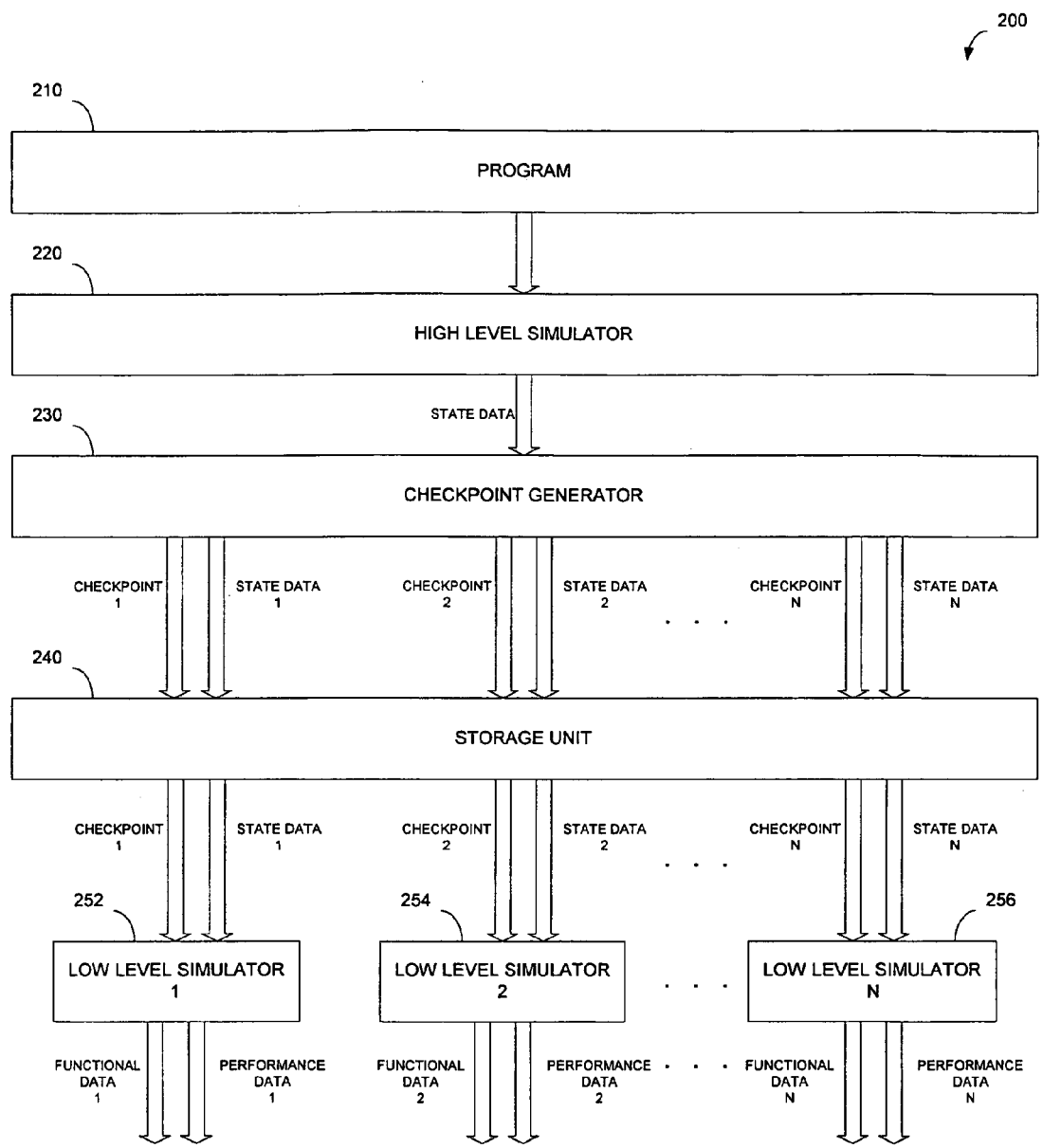
FIG. 2 is a block diagram of a processor validation system according to the present invention.

FIG. 2 is a block diagram of a processor validation system 200 according to the present invention. Processor validation system 200 includes a program 210, a high level simulator 220 of the processor, a checkpoint generator 230, a storage unit 240, and a plurality of low level simulators 252, 254, 256 of the processor.

In the operation of processor validation system 200, program 210 is executed on high level simulator 220, which generates state data. Next, checkpoint generator 230 establishes a plurality of checkpoints, checkpoint 1, checkpoint 2, and checkpoint N. Then, state data, state data 1, state data 2, and state data N, at each of the checkpoints, is saved in storage unit 240. Finally, program 210 is run on the plurality of low level simulators 252, 254, 256, in parallel, where each of low level simulators 252, 254, 256, is started at a corresponding checkpoint (checkpoint 1, checkpoint 2, checkpoint N) with corresponding state data (state data 1, state data 2, state data N) associated with the corresponding checkpoint, For example, low level simulator 252, designated as low level simulator 1, is started at its corresponding checkpoint 1 with its corresponding state data 1. In a further embodiment, the plurality of checkpoints, checkpoint 1, checkpoint 2, and checkpoint N, is saved in storage unit 240. In another embodiment program 210 is run on one low level simulator where the low level simulator is started at a checkpoint with state data associated with the checkpoint.

In a further embodiment, when program 210 is executed on high level simulator 220, high level simulator 220 is loaded with program 210. Next, program 210 is run in its entirety on high level simulator 220.

In a specific embodiment, when running the plurality of low level simulators 252, 254, 256, each of the low level simulators is loaded with program 210. Next, each of the low level simulators 252, 254, 256, is initialized at the corresponding checkpoint (checkpoint 1, checkpoint 2, checkpoint N) with the corresponding state data (state data 1, state data 2, state data N) associated with the corresponding checkpoint. Then, program 210 is executed on low level simulator 252, 254, 256, up to a certain point in the program. In a further embodiment, low level simulator 252, 254, 256, generates functional data, functional data 1, functional data 2, functional data N, of the processor. In a specific embodiment, the functional data can be used by validation software or an assertion checker to provide indications of whether the processor has a flaw, or bug, in its design. In another embodiment, low level simulator 252, 254, 256, generates performance data, performance data 1, performance data 2, performance data N, of the processor. In a specific embodiment, the performance data includes cycles per instruction and cache miss rates. In a further embodiment, each of the low level simulators 252, 254, 256, generates low level simulator state data, low level simulator state data 1, low level simulator state data 2, low level simulator state data N.

Program

In an embodiment, program 210 is an operating system bootup program. In another embodiment, program 210 is a long-running benchmark program. In a different embodiment, program 210 is a long-running program.

Checkpoints

In a specific embodiment, a checkpoint includes a snapshot of the entire state, the state data, of the processor as generated by high level simulator 220 while executing program 210 during a corresponding interval of the program. In a further embodiment, a checkpoint contains enough state data of the processor such that it is possible to restart a low level simulator 252, 254, or 256, from the same point in program 210, as if the low level simulator 252, 254, or 256 itself had executed all of the instructions before the checkpoint. In a specific embodiment, a checkpoint includes the value of the program counter (PC) at the point in the program corresponding to the checkpoint. The state in which low level simulator 252, 254, or 256 restarts may not be exactly the same as the state it would have reached if it had executed all the instructions before the checkpoint, since high level simulator 220 may not model all timings completely accurately. However, the difference between these two states would be relatively minor.

State Data

In a specific embodiment, the state data includes (1) register contents of the processor, (2) cache memory contents of the processor, (3) main memory contents of the processor, and (4) branch prediction contents of the processor. In another embodiment, the state data also includes program counter contents of the processor.

Processor

In a further embodiment, the processor may be a central processing unit (CPU) or virtually any digital design that maintains and updates state over a long series of transactions. In a specific embodiment, the processor is a microprocessor. The processor can also be a digital signal processor, an input/output (I/O) controller, or a network processor.

High Level Simulator

In another embodiment, the high level simulator is an instruction accurate simulator (IAS) of the processor. In a further embodiment, the high level simulator is a cycle accurate simulator (CAS) of the processor.

Low Level Simulator

In a specific embodiment, each of the low level simulators is a register transfer level (RTL) model of the processor. In another embodiment, each of the low level simulators is a VHDL model of the processor. In a different embodiment, each of the low level simulators is a Verilog model of the processor. In another embodiment, each of the low level simulators is a gate level model of the processor. In another embodiment, each of the low level simulators is a hardware emulator configured with the design of the processor. One type of hardware emulator is a set of field programmable gate arrays (FPGAs), which, when configured with the design of the processor, would map each logical element of the processor into reconfigured hardware of the FPGAs.

Checkpoints, Code Fragments, and Low Level Simulator Runs

Figure 3A:
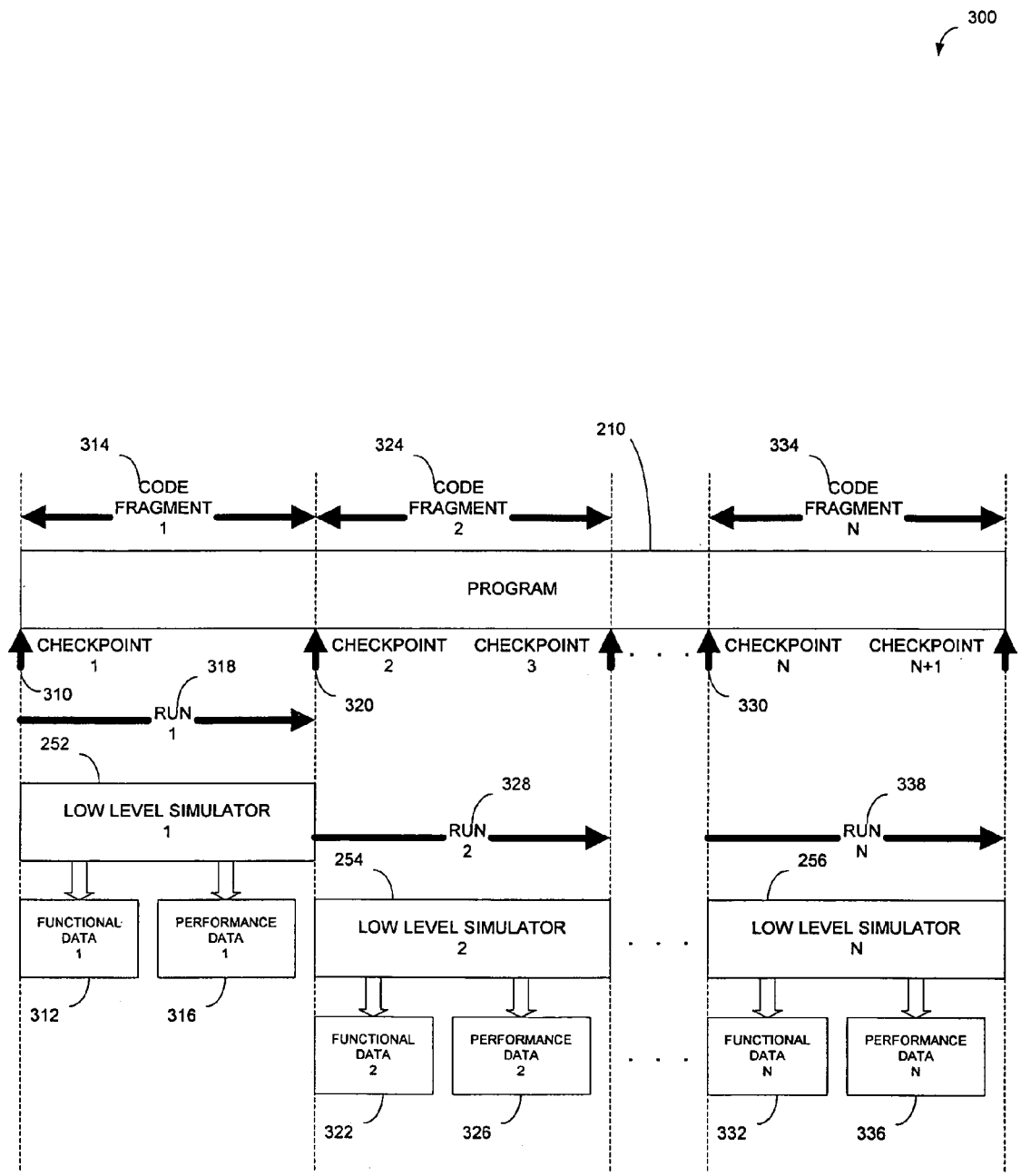
FIGS. 3A and 3B are block diagrams of systems of checkpoints, code fragments, and runs of low level simulators.
Figure 3B:
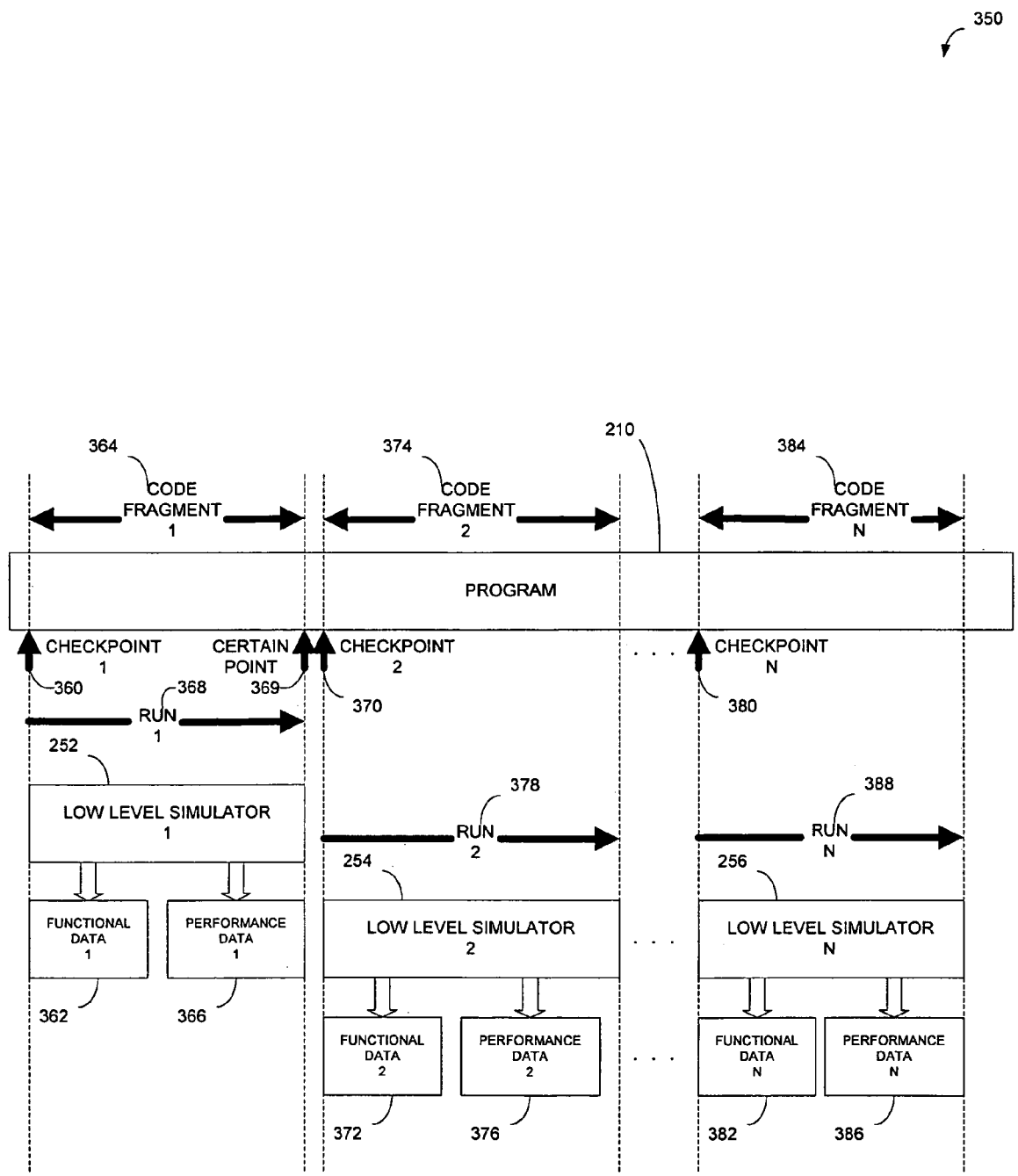

FIGS. 3A and 3B are block diagrams of systems of checkpoints, code fragments, and runs of low level simulators.

Entire Program

FIG. 3A is a block diagram of one type of system 300, which includes program 210, checkpoints 310, 320, 330, code fragments 314, 324, 334, runs 318, 328, 338 on low level simulators 252, 254, 256, functional data 312, 322, 332, and performance data 316, 326, 336. In a specific embodiment, checkpoints 310, 320, 330 cover program 210 entirely. In a further embodiment, checkpoints 310, 320, 330 divide program 210 into code fragments 314, 324, 334 of determined lengths. In a specific embodiment, the determined length code fragments are equal length code fragments.

In another embodiment, program 210 is executed on each of low level simulator 252, 254, 256 up to a certain point, where each certain point is the next checkpoint immediately following the corresponding checkpoint, 310, 320, 330. For example, program 210 is run on low level simulator 252, beginning at checkpoint 310 and ending at the next checkpoint, which is checkpoint 320. Runs 318, 328, 338 signify the executions of low level simulators 252, 254, 256. In another embodiment, the certain point is a point in program 210 before or after the next checkpoint immediately following the corresponding checkpoint, 310, 320, 330 but after the corresponding checkpoint.

Highly Accurate Functional and Performance Data

In such embodiments, functional data 312, 322, 332 (functional data 1, functional data 2, functional data N) of the processor generated by low level simulators 252, 254, 256 could help to provide a highly accurate validation of the functionality of the processor, while performance data 316, 326, 336 (performance data 1, performance data 2, performance data N) of the processor generated by low level simulators 252, 254, 256 could provide a highly accurate prediction of the performance of the processor. This could be especially true in a specific embodiment where checkpoints 310, 320, 330 cover program 210 entirely and where program 210 is executed on each of low level simulators 252, 254, 256 up to a certain point, where each certain point is the next checkpoint immediately following the corresponding checkpoint, 310, 320, 330.

Random Parts of the Program

FIG. 3B is a block diagram of another type of system 350, which includes program 210, checkpoints 360, 370, 380, code fragments 364, 374, 384, runs 368, 378, 388 on low level simulators 252, 254, 256, functional data 362, 372, 382, and performance data 366, 376, 386. In a specific embodiment, checkpoints 360, 370, 380 cover random parts of program 210. In a further embodiment, checkpoints 360, 370, 380 divide program 210 into code fragments 364, 374, 384 of random lengths. In another embodiment, code fragments 364, 374, 384 do not overlap. In a different embodiment, code fragments 364, 374, 384 are not connected.

In another embodiment, program 210 is executed on each of low level simulators 252, 254, 256 up to a certain point, where each certain point is a point in the program a random length after the corresponding checkpoint 360, 370, 380. For example, program 210 is run on low level simulator 252, beginning at checkpoint 360 and ending at certain point 369. Runs 368, 378, 388 signify the executions of low level simulators 252, 254, 256. In another embodiment, the certain point is a point in program 210 a determined length after the corresponding checkpoint 360, 370, 380.

Statistically Accurate Functional and Performance Data

In a further embodiment, functional data 362, 372, 382 (functional data 1, functional data 2, functional data N) of the processor generated by low level simulators 252, 254, 256 are statistically extrapolated to represent the functionality of the processor over the entire program. In such an embodiment, the extrapolation of the functional data could provide a statistical confidence in the functionality of the processor. In another embodiment, performance data 366, 376, 386 (performance data 1, performance data 2, performance data N) of the processor generated by low level simulators 252, 254, 256 are statistically extrapolated to represent the performance of the processor over the entire program. In such an embodiment, the extrapolation of the performance data could provide a statistically accurate prediction of the performance of the processor. This could be especially true in a specific embodiment where checkpoints 360, 370, 380 cover random parts of program 210, where checkpoints 360, 370, 380 divide program 210 into code fragments 364, 374, 384 of random lengths, where code fragments 364, 374, 384 do not overlap, where code fragments 364, 374, 384 are not connected, and where program 210 is executed on each of low level simulators 252, 254, 256 up to a certain point, where each certain point is a point in the program a random length after the corresponding checkpoint 360, 370, 380.

Flowchart of the Operation of the Processor Validation System

Figure 4:
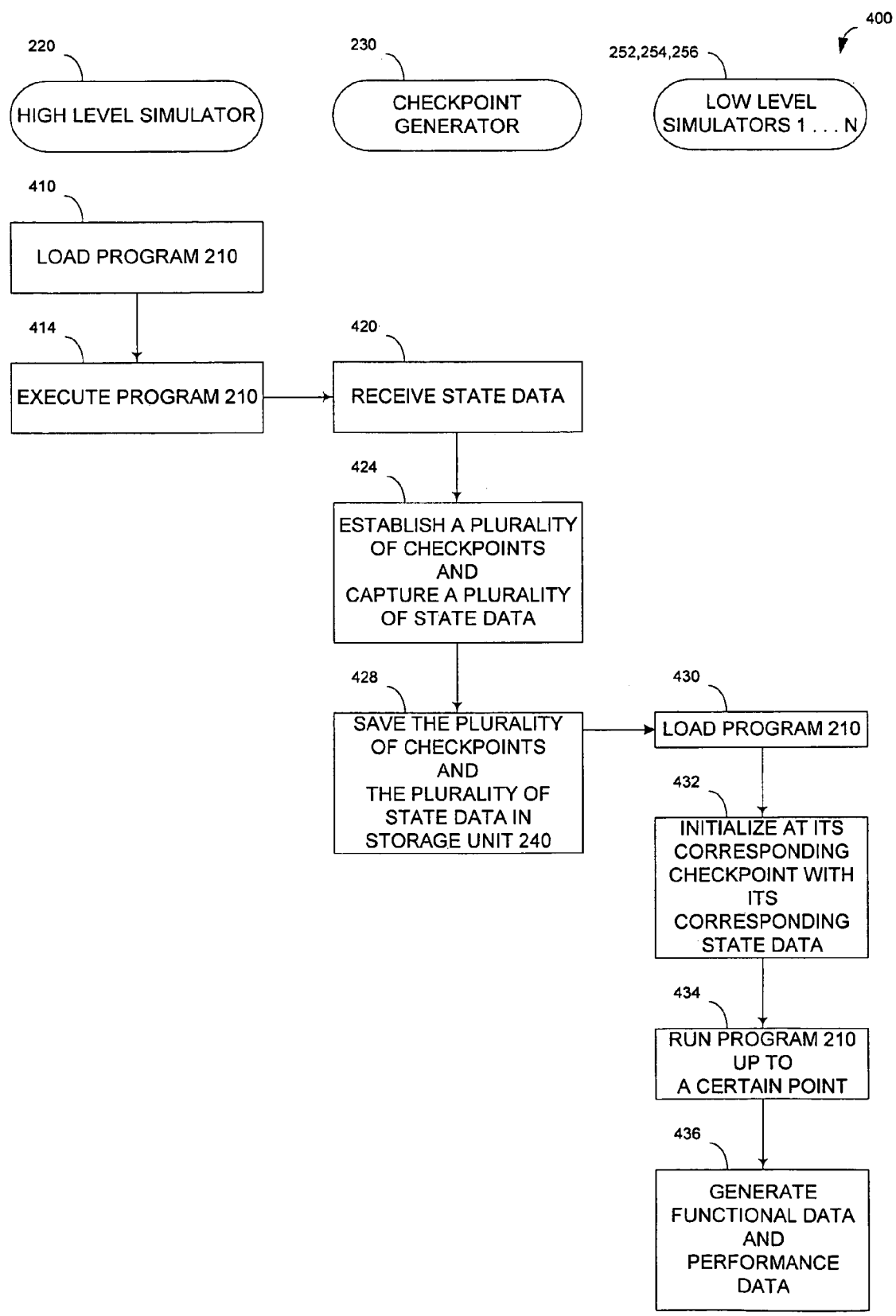
FIG. 4 is a flowchart of the processor validation system according to the present invention.

FIG. 4 is a flowchart 400 of the processor validation system according to the present invention. First, at step 410, high level simulator 220 is loaded with program 210. Next, at step 414, high level simulator 220 executes program 210 and generates state data. In a specific embodiment, program 210 is run in its entirety on high level simulator 220.

Afterwards, at step 420, checkpoint generator 230 receives state data from high level simulator 220. Next, at step 424, checkpoint generator 230 establishes a plurality of checkpoints, checkpoint 1, checkpoint 2, and checkpoint N, and captures a plurality of state data, state data 1, state data 2, state data N, corresponding to the plurality of checkpoints. In step 428, checkpoint generator 230 saves the plurality of checkpoints (checkpoint 1, checkpoint 2, checkpoint N) and the plurality of corresponding state data (state data 1, state data 2, state data N) in storage unit 240.

In step 430, each of low level simulators 252, 254, 256 is loaded with program 210. Next, in step 432, each of the low level simulators 252, 254, 256, is initialized at the corresponding checkpoint (checkpoint 1, checkpoint 2, checkpoint N) with the corresponding state data (state data 1, state data 2, state data N) associated with the corresponding checkpoint. Then, in step 434, program 210 is run on each of low level simulators 252, 254, 256, up to a certain point in the program. In step 436, each of low level simulators 252, 254, 256, generates functional data, functional data 1, functional data 2, functional data N, of the processor and performance data, performance data 1, performance data 2, performance data N, of the processor.

Memory of Low Level Simulator

Figure 5:
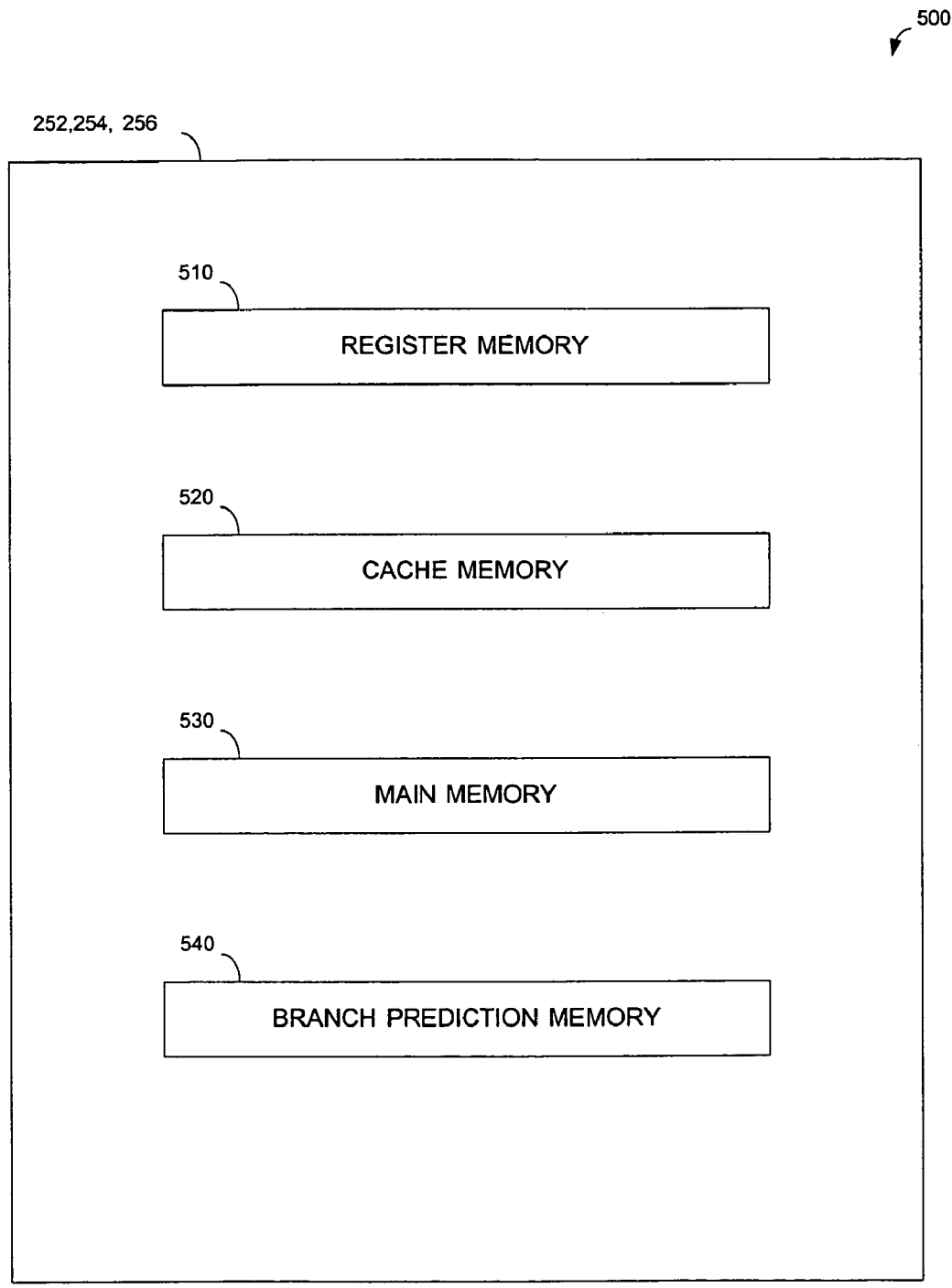
FIG. 5 is a block diagram of the memory of a low level simulator in an embodiment of the present invention.

FIG. 5 is a block diagram of the memory 500 of a low level simulator 252, 254, 256 in an embodiment of the present invention. Memory 500 includes a register memory 510, a cache memory 520, a main memory 530, and a branch prediction memory 540. In a specific embodiment, register memory 510 includes the register contents of the processor. In another embodiment, cache memory 520 includes the cache memory contents of the processor. In a further embodiment, main memory 530 includes the main memory contents of the processor. In a different embodiment, branch prediction memory 540 includes the branch prediction contents of the processor. For example, in a low level simulator, (1) memory locations 1 to 100 may be allocated to register memory 510, (2) memory locations 101 to 200 may be allocated to cache memory 520, (3) memory locations 201 to 1000 may be allocated to main memory 530, and (4) memory locations 1001 to 1100 may be allocated to branch prediction memory 540. In another embodiment, memory 500 includes a program counter memory. In a specific embodiment, the program counter memory includes the program counter contents of the processor. For example, memory locations 1101 to 1200 may be allocated to the program counter memory. In another embodiment, memory 500 includes a value prediction memory. In a specific embodiment, the value prediction memory includes the value prediction contents of the processor. For example, memory locations 1201 to 1300 may be allocated to the value prediction memory.

Initializing Low Level Simulators

In a further embodiment, when initializing low level simulators 252, 254, 256 at their corresponding checkpoints with their corresponding state data, the low level simulators are reset and started according to the processor's specific design. In a specific embodiment, the register contents of the processor are first stored in unused memory locations in main memory 530, register memory 510 is next setup with the register contents of the processor, and then cache memory 520 is enabled and setup with the cache memory contents of the processor. In a further embodiment, some registers in register memory 510 may need to be enabled and setup at the same time, and the program counter memory (PC) is then set with the corresponding PC value.

Implementation of High Level Simulator and of the Invention Overall

Figure 6:
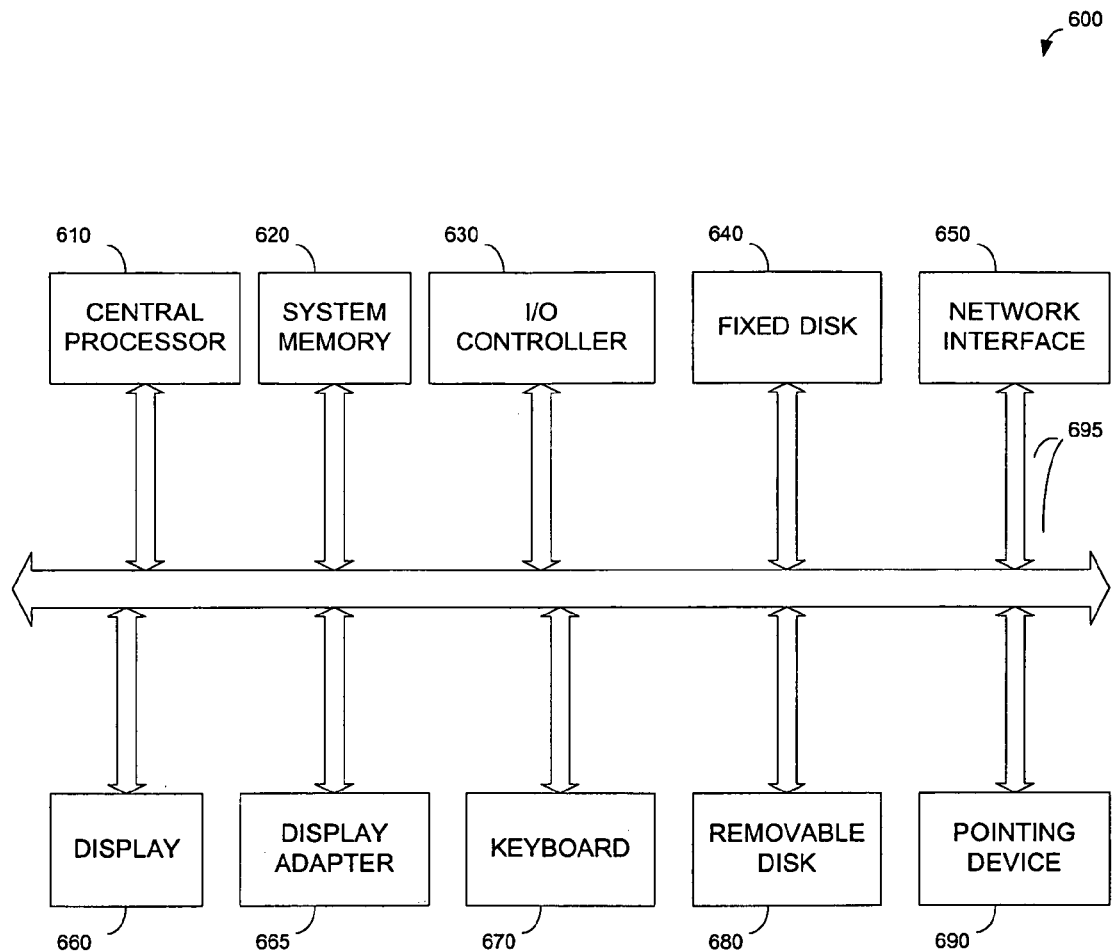
FIG. 6 is a simplified block diagram of a computer system which implements a high level simulator and the running of the invention overall in an embodiment of the present invention.

FIG. 6 is a simplified block diagram of a computer system 600 which implements a high level simulator 220 and the running of the invention overall in an embodiment of the present invention. This diagram is merely an example and should not limit the scope of the claims herein. One of ordinary skill in the art would recognize other variations, modifications, and alternatives. Computer system 600 includes subsystems such as a central processor 610, a system memory 620, an I/O controller 630, a fixed disk 640, and a network interface 650. Computer system 600 may also include a display 660, a display adapter 665, a keyboard 670, a removable disk 680, and a pointing device 690. Other computer systems suitable for use with the present invention may include additional or fewer subsystems. For example, another computer system could include more than one processor 610 (i.e., a multi-processor system) or a cache memory as part of system memory 620.

Arrows such as 695 represent the system bus architecture of computer system 600. However, these arrows are illustrative of any interconnection scheme serving to link the subsystems. For example, a local bus could be utilized to connect the central processor to the system memory and display adapter. Computer system 600 is but an example of a computer system suitable for use with the present invention. Other configurations of subsystems suitable for use with the present invention will be readily apparent to one of ordinary skill in the art.

Uses

In an exemplary use of the present invention, processor validation system 200 could divide the simulation of a longer running benchmark program into 10,000 separate jobs, each of which could require about two hours to run and could run in parallel. If one thousand computers were available to processor validation system 200, the simulation could be completed in about twenty hours versus the two and one-half years required by the RTL model of the processor.

Furthermore, if only a statistically close measure of performance is required, processor validation system 200 could generate checkpoints which divide program 210 into random parts. In this example, processor validation system 200 could statistically sample only 5% of the jobs, measure the number of cycles required for those 5%, and multiply the result by 20 to get a statistical performance measure of the entire program in a little over an hour of elapsed run time.

The invention has been explained with reference to a specific embodiment. Other embodiments will be apparent to those of ordinary skill in the art. For example, the invention could be applied to multiple processors. This could be multiple processors on a single chip, or some combination of a CPU, digital signal processor, I/O controller and network controller. It is therefore not intended that this invention be limited, except as indicated by the appended claims.

What is claimed is:

1. A computer-implemented method comprising the steps of:
   executing a program on a high level simulator of a processor; thereafter
   dividing the program into a plurality of independent code fragments such that a destination branch of an instruction in each code fragment falls within that code fragment; thereafter
   establishing a plurality of checkpoints; wherein each of the plurality of checkpoints is established along a beginning point of a different one of the code fragments; thereafter
   saving state data at each of said checkpoints; wherein said state data comprises:
   program counter contents of said processor;
   register contents of said processor;
   cache memory contents of said processor;
   main memory contents of processor; and
   branch prediction contents of said processor; thereafter
   executing instructions in said program on a plurality of low level simulators of said processor in parallel, starting each of said low level simulators at a corresponding checkpoint with corresponding state data associated with said corresponding checkpoint, wherein said executing instructions step further comprises the steps of:
   loading each of said low level simulators with said program;
   initializing each of said low level simulators at said corresponding checkpoint with said corresponding state data associated with said corresponding checkpoint; and
   executing said program on said low level simulator up to a certain point in said program; and thereafter
   generating functional data to validate functionality of the processor.

2. The computer-implemented method of claim 1 further comprising:
   generating performance data to validate performance of the processor.

3. The computer-implemented method of claim 1 wherein each code fragments has one of random lengths and determined length.

4. The computer-implemented method of claim 1 wherein said processor is one of (a) a microprocessor, (b) a digital signal processor, (c) an input/output (I/O) controller, and (d) a network processor.

5. The computer-implemented method of claim 1 wherein said high level simulator is one of (a) an instruction accurate simulator (IAS) of said processor and (b) a cycle accurate simulator (CAS) of said processor.

6. The computer-implemented method of claim 1 wherein each of said low level simulators is a register transfer level (RTL) model of said processor, written as one of (a) a VHDL model of said processor and (b) a Verilog model of said processor.

7. The computer-implemented method of claim 1 wherein said certain point is one of (a) a next checkpoint immediately following said corresponding checkpoint, (b) a point in said program a random length after said corresponding checkpoint, and (c) a point in said program a determined length after said corresponding checkpoint.

8. A computer readable media having stored thereon a program comprising computer readable instructions for:
   executing a program on a high level simulator of a processor; thereafter
   dividing the program into a plurality of independent code fragments such that a destination branch of an instruction in each code fragment falls within that code fragment; thereafter
   establishing a plurality of checkpoints; wherein each of the plurality of checkpoints is established along a beginning point of a different one of the code fragments; thereafter
   saving state data at each of said checkpoints; wherein said state data comprises:
   program counter contents of said processor;
   register contents of said processor;
   cache memory contents of said processor;
   main memory contents of said processor; and
   branch prediction contents of said processor; thereafter
   executing instructions in said program on a plurality of low level simulators of said processor in parallel, starting each of said low level simulators at a corresponding checkpoint with corresponding state data associated with said corresponding checkpoint; wherein said executing of instructions further comprises the steps of:
   loading each of said low level simulators with said program;
   initializing each of said low level simulators at said corresponding checkpoint with said corresponding state data associated with said corresponding checkpoint; and
   executing said program on said low level simulator up to a certain point in said program; and thereafter
   generating functional data to validate functionality of the processor.

9. The computer readable media of claim 8 further comprising instructions for:
   generating performance data to validate performance of the processor.

10. The computer readable media of claim 8 wherein each code fragment has one of random length and determined length.

* * * * *